United States Patent [19]

Flasza

[11] 4,323,924
[45] Apr. 6, 1982

[54] AUTOMATIC PHASE ADJUSTING CIRCUIT FOR A SYNCHRONOUS DETECTOR

[75] Inventor: Michael D. Flasza, Schaumburg, Ill.

[73] Assignee: Zenith Radio Corporation, Glenview, Ill.

[21] Appl. No.: 194,169

[22] Filed: Oct. 6, 1980

[51] Int. Cl.³ .............................................. H04N 5/44
[52] U.S. Cl. .................................................... 358/188
[58] Field of Search ................. 358/188, 23, 160; 455/208, 255, 257, 260, 265; 329/50, 122

[56] References Cited

U.S. PATENT DOCUMENTS

| | | | |
|---|---|---|---|
| 3,057,954 | 10/1962 | Harling et al. | 358/188 |
| 3,626,090 | 12/1971 | Akiyama et al. | 358/188 |
| 3,750,029 | 7/1973 | Baars | 358/188 |
| 4,157,569 | 6/1979 | Apeldoorn et al. | 358/160 |

*Primary Examiner*—Richard Murray

[57] ABSTRACT

A phasing circuit is described for automatically controlling the phase of an oscillator input to a synchronous detector which demodulates a video signal in a television receiver. A conventional phase locked loop develops an oscillator signal whose phase tracks with variations in the phase of a video intermediate frequency (I.F.) signal applied to the loop. The automatic phasing circuit includes a phase adjustment network for coupling the video I.F. signal to the phase locked loop and for varying the phase of the latter signal input to the loop in response to a phase correction signal. The phase correction signal is preferably developed by a multiplier which senses the video I.F. signal and the input to the phase locked loop and controls the phase adjustment network such that the latter network varies the phase of the video I.F. input to the phase locked loop until the phase of the oscillator signal has a selected phase relationship to the video I.F. signal input to the synchronous detector.

9 Claims, 7 Drawing Figures

AUTOMATIC PHASE ADJUSTING CIRCUIT FOR A SYNCHRONOUS DETECTOR

BACKGROUND OF THE INVENTION

The present invention is directed to television receivers, and particularly to synchronous detection systems for use in such receivers.

Television receivers of the type considered herein include a synchronous detector which receives a 45 megahertz oscillator signal and a 45 megahertz video I.F. signal for synchronously demodulating the composite video signal. The oscillator signal is typically derived by applying the video I.F. signal to a limiter which is manually tuned to provide optimum differential phase response. The output of the limiter is coupled to a phase locked loop in which a phase detector receives the oscillator output of a VCO (voltage controlled oscillator) and the output of the limiter to develop an error signal which locks the frequency of the VCO to the frequency of the video I.F. signal. The oscillator signal thus developed is applied to one input of the synchronous detector.

To ensure that the VCO input to the synchronous detector and the video input thereto are at a selected phase with respect to each other (zero degrees, for example), a manually operable phase adjustment network may be included in the phase locked loop. By appropriate adjustment of this network the phase of the VCO input to the synchronous detector may be adjusted so that it is precisely in phase with the video input.

Although the arrangement described above performs satisfactorily, manufacturing costs can be reduced if the phase adjustment network is eliminated and the limiter is manually tuned to provide the required phase shift for the VCO signal input to the synchronous detector. If that option is selected, tuning the limiter to achieve the proper phase of the VCO signal may result in sub-standard differential phase response in the limiter. The present invention overcomes this problem in a manner that permits the limiter to be adjusted for best differential phase response and yet eliminates the cost associated with manually adjusting the phase adjustment network.

OBJECTS OF THE INVENTION

It is a general object of the invention to provide a phasing circuit which automatically adjusts the relative phases of oscillator and video I.F. inputs to a synchronous detector in a television receiver.

It is a more specific object of the invention to provide such a phasing circuit which holds the inputs to the synchronous detector at a selected relative phase irrespective of variations in limiter tuning.

BRIEF DESCRIPTION OF THE FIGURES

The objects stated above and other objects of the invention are set forth more particularly in the following detailed description and in the accompanying drawings, of which.

DESCRIPTION OF THE PREFERRED EMBODIMENT

Figure 1:
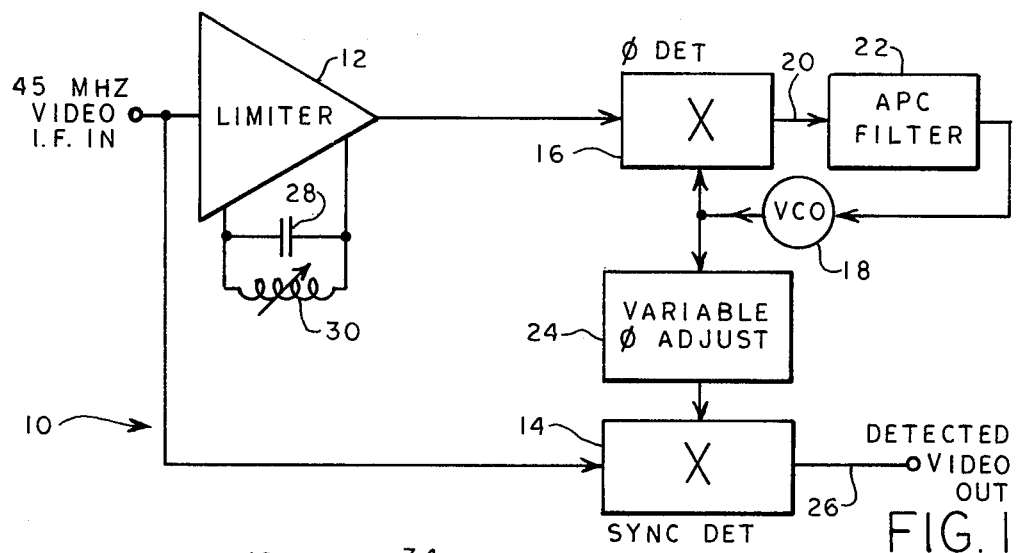
FIG. 1 illustrates a synchronous detection system requiring two manual adjustments.

Referring now to FIG. 1, there is shown a synchronous detection system 10 of the type which requires two manual adjustments for proper operation. The illustrated system receives a 45 megahertz video input which is applied to a tuneable limiter 12 and to a synchronous detector 14. The output of the limiter 12 is an amplitude-limited video I.F. signal which is applied to a phase detector 16. The detector 16 also receives an oscillator signal from a VCO 18 for generating, at a lead 20, an error signal corresponding to the difference in frequency and phase between the VCO signal and the video I.F. signal. The error signal is conventionally coupled to an A.P.C. (automatic phase control) filter 22 for application of the filtered error signal to the VCO 18. With this arrangement, the VCO 18 is caused to generate an oscillator signal whose frequency is equal to the video input signal.

The output of the VCO 18 is also coupled to the synchronous detector 14 via a phase adjustment network 24. Typically, the latter network is adapted to be manually adjusted for altering the phase of the VCO signal so that it is in phase with the video I.F. signal received by the detector 14. In this manner, a detected video signal is developed at an output lead 26.

As shown, the limiter 12 includes a capacitor 28 and a variable coil 30, the latter of which is manually tuned so that the limiter provides optimum differential phase response. Such adjustment of the coil 28 changes the phase of the signal input to the phase detector 16 and the phase of the VCO's oscillator signal. The phase adjustment network 24 is then manually adjusted to bring the VCO input to the detector 14 into phase with the video input thereto.

Figure 2:
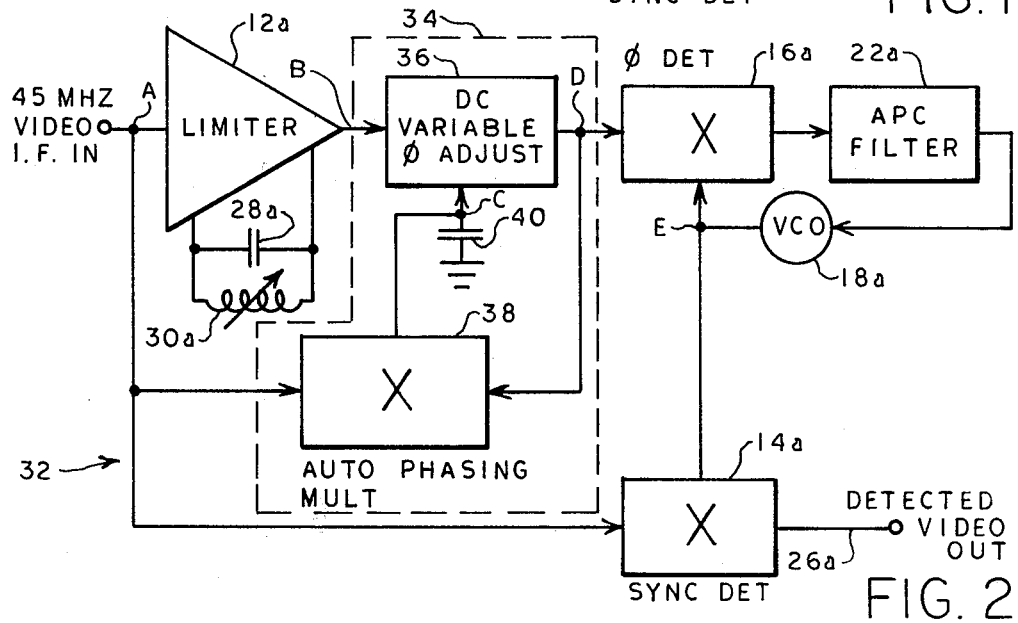
FIG. 2 shows a synchronous detection system employing an automatic phasing circuit according to the invention for eliminating one of the manual adjustments associated with the system of FIG. 1.

Elimination of the manual adjustment to the network 24 is accomplished in the synchronous detection system 32 of FIG. 2. In the latter figure, elements which correspond to those of FIG. 1 are identified by like reference numerals followed by the alpha character "a". In this embodiment, an automatic phasing circuit 34 is included to eliminate the manual adjustment of the network 24 (FIG. 1).

Referring first to the limiter 12a, its video input at a node A may be phase shifted at the output of the limiter (node B) by from −20° to −60°, depending on the adjustment made to the coil 30a. For purposes of discussion, it will be assumed that a phase shift of −20° is effected from node A to node B.

Included in the automatic phasing network 34 is a D.C. variable phase adjustment network 36 which receives the signal output of the limiter 12a and varies the phase of that signal in response to a D.C. phase correction signal applied to a node C. Suffice it to say at this juncture that the signal output from the network 36 (at node D) is the same as the signal at node B but shifted in phase by −70°, for example. Hence, the signal at node D is phase shifted by −90° from the signal at node A.

The signal at node D is coupled to a conventional phase locked loop comprising a phase detector 16a, a VCO 18a, and an A.P.C. filter 22a. Operating coventionally, the phase locked loop applies to the synchronous detector 14a, an oscillator signal which is frequency locked to the frequency (45 megahertz) of the input video signal. The phase of the oscillator signal is determined, in part, by the characteristics of the phase detector 16a.

Figure 3:
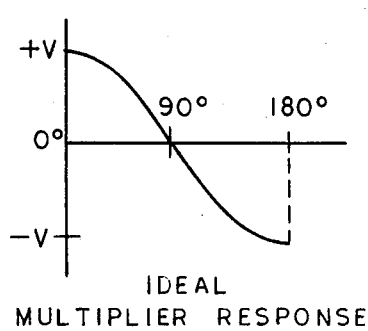
FIG. 3 depicts the output characteristics of an ideal multiplier for use in explaining the operation of the system shown in FIG. 2.

In the embodiment of FIG. 2, the phase detector 16a may be of the type referred to as a "balanced multiplier". The ideal output characteristics of such a multiplier, when operating linearly, are depicted in FIG. 3. As shown, when the phase difference between the multiplier's inputs is zero degrees, it develops an error signal of +V. A difference in phase of 90 degrees between the multiplier's inputs results in zero error signal. It is in this latter condition that the multiplier operates when frequency lock is achieved. Thus, the phase detector 16a operates such that a phase difference of 90 degrees exists between nodes D and E (FIG. 2).

It will be recalled that it was assumed that a −90° phase difference existed between the signals at nodes A and D. With a +90° phase difference between the input to the phase detector (node D) and the oscillator input to the synchronous detector (node E), a net phase shift of zero degrees is achieved between the video input to the synchronous detector and its oscillator input. This is the desired condition in which the synchronous detector operates.

To hold the output of the oscillator signal at its selected phase (zero degrees in this example) an automatic phasing multiplier 38 is coupled between the nodes A and D for sensing the signals at those nodes and for developing and coupling to the phase adjustment network 36 a phase correction signal. The latter signal is such that the network 36 causes the phase of the oscillator signal at node E to be varied until it has the selected phase relationship to the synchronous detector's video input.

To achieve the above-stated result, the multiplier 38 is preferably selected to be a balanced multiplier so that, ideally, it has the output characteristics shown in FIG. 3. That is, it develops a zero amplitude error signal at node C when the signals at nodes A and D are phase-shifted by 90 degrees. When that phase difference is other than 90 degrees, the multiplier 38 develops an error signal at node C to which the adjustment network 36 responds by altering the phase of the signal at node D until the error signal is reduced to zero. A capacitor 40 may be coupled to the node C to filter the output of the multiplier 38.

With this arrangement, the coil 30a may be manually adjusted so that the limiter 12a has the desired differential phase response. The resultant shift in phase between the signals at nodes A and D is sensed by the multiplier 38 and an error signal is developed at node C for causing the phase adjustment network 36 to vary the phase difference between the signals at nodes B and C until the signals at nodes A and D differ in phase by −90°. The phase detector 16a, of course, causes the signal at node E to be phase-shifted by +90° with respect to the signal at node D. Consequently, the synchronous detector 14a demodulates the input video signal along a zero degree detection axis.

In construction, it is preferred that the phase detector 16a and the multiplier 38 be matched to each other so that they have similar output characteristics. Both are preferably balanced multipliers of the conventional type. The limiter 12a and the components in the phase locked loop may also be conventional as may be the synchronous detector 14a. The phase adjustment network 36 is preferably of the type described in U.S. application Ser. No. 54,325, filed July 2, 1979 now U.S. Pat. No. 4,253,118.

Figure 4:
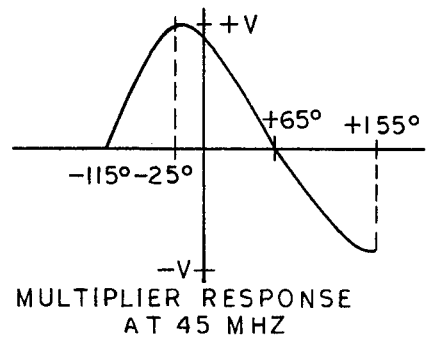
FIG. 4 depicts the output characteristics of a non-ideal multiplier operating a 45 megahertz.

It will be appreciated that the multiplier characteristics shown in FIG. 3 may be difficult to achieve when the video signal is at a frequency of 45 megahertz. The high frequency delays inherent in presently available transistors cause the operating characteristics of balanced multipliers to be more nearly like the curve depicted in FIG. 4, to which reference is now made.

The illustrated curve represents the output characteristics of a balanced multiplier constructed of transistors having an $f_t$ of about 550 megahertz. A phase lag in the multiplier of about 25 degrees causes the multiplier to develop a zero voltage error signal at 65 degrees rather than 90 degrees.

In the case in which the multiplier 38 is reasonably well matched to the phase detector 16a, each develop zero voltage error signals when the phase difference between its inputs is about 65 degrees. Hence, each may be thought of as an ideal multiplier in series with a delay $T_1$ of 25 degrees. The synchronous detector 14a, also preferably of the balanced multiplier type, may operate with input biasing levels, input drive levels, etc., which cause its delay to be different from the delays of the multiplier 38 and the phase detector 16a. The synchronous detector may, therefore, be thought of as an ideal detector in series with its own delay $T_2$ which may differ from $T_1$. A detection system based on the embodiment of FIG. 2, but including the delays $T_1$ and $T_2$, is shown in FIG. 5.

Figure 6:
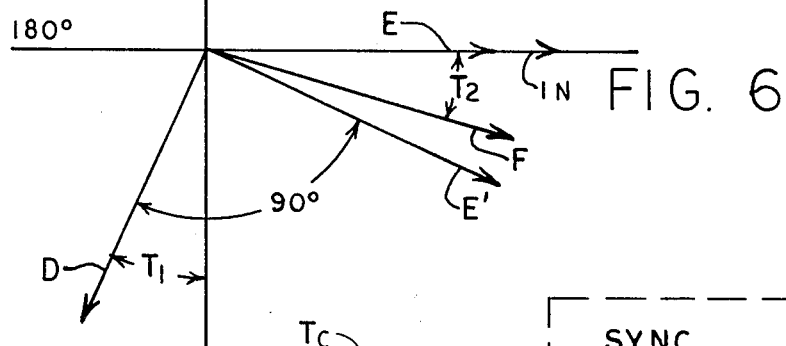
FIG. 6 is a vector diagram illustrating the phases of various signals developed in the system shown in FIG. 5.

The multiplier 38 is shown in series with a delay $T_1$ which represents the 25 degree phase difference between an ideal multiplier and an actual multiplier operating at 45 megahertz. The phase detector 16a is likewise shown in series with a similar phase delay $T_1$, and the synchronous detector 14a is shown in series with its phase delay $T_2$. Taking into account the illustrated phase delays, the phase angles at which the various signals appear is as shown by the vector diagram of FIG. 6.

In the latter figure, the input video signal is represented by the vector "IN" which lies on the zero degree axis. The signal at node D is represented by the vector D which is offset from the vector IN by −90° plus the delay $T_1$ associated with the multiplier 38. The signal at the output of the phase detector 16a is represented by the vector E'. The latter vector leads the vector D by 90 degrees to reflect the ideal characteristics of the phase detector 16a. The VCO signal at node E is phase shifted from the signal at node E' by $T_1$ as shown by the vector E. Hence, the two $T_1$ delays effectively cancel to render the VCO signal (E) in phase with the video input signal (IN).

Figure 5:
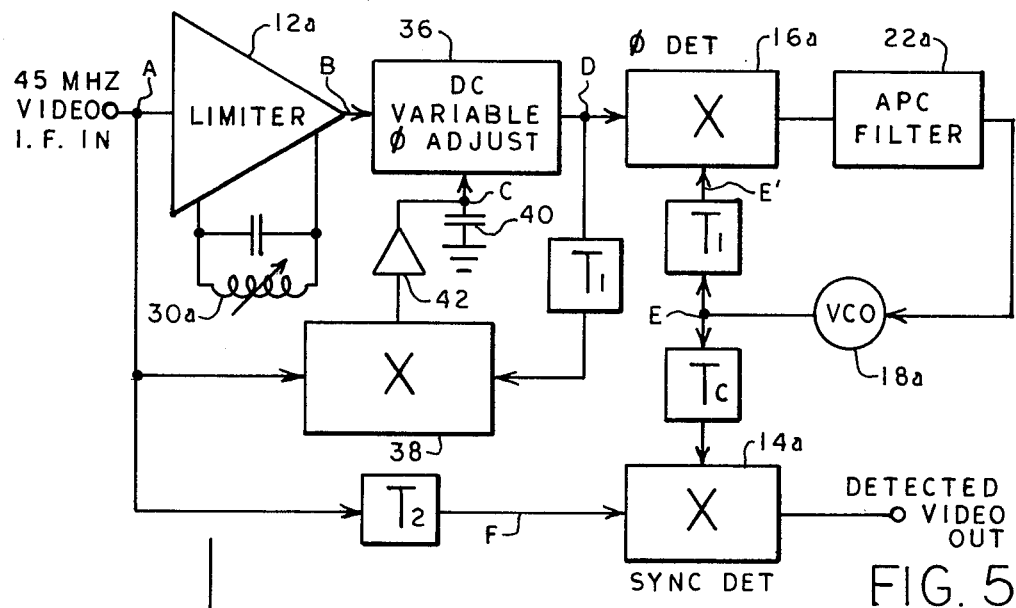
FIG. 5 shows the system of FIG. 2, including phase delays associated with the multipliers of FIG. 2.

Referring to FIG. 5, it can be seen that the video input (F) to the synchronous detector 14a is phase-shifted from the video signal at node A by $T_2$. This condition is illustrated by the vector F in FIG. 6.

In order to eliminate the phase difference which exists between the two inputs to the synchronous detector, a compensating delay network $T_c$ is coupled between the VCO 18a and the synchronous detector as shown in FIG. 5. The delay network $T_c$ is selected to have a delay equal to the delay $T_2$ so that the two inputs to the synchronous detector are in phase. The multiplier 38 and the phase adjustment network 36 operate to hold those detector inputs in phase irrespective of variations in the tuning of the coil 30a.

In some applications, it may be desirable to increase the gain of the loop comprising the multiplier 38, the phase adjustment network 36 and the delay $T_1$. To achieve a higher gain, an amplifier 42 may be included as shown between the multiplier 38 and the node C.

Figure 7:
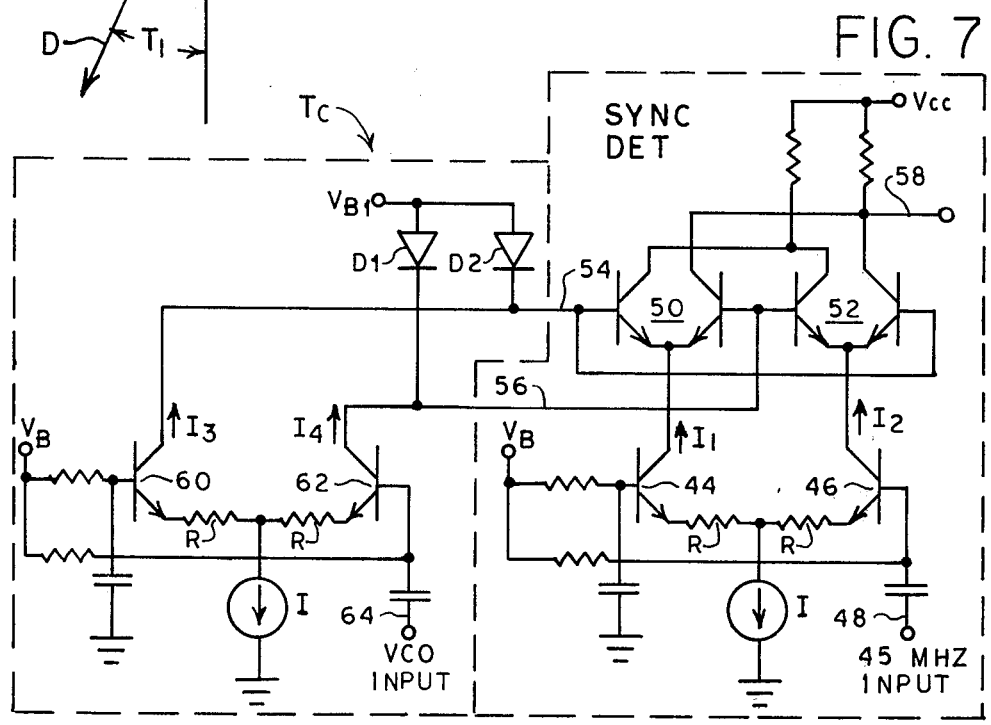
FIG. 7 shows details of the synchronous detector and the delay compensation network of FIG. 5.

As stated above, the delays $T_2$ and $T_c$ should be closely matched if the synchronous detector's inputs are desired to be in phase with each other. To achieve this result, the portion of the synchronous detector which introduces the delay $T_2$ may be duplicated in the network $T_c$. If, for example, the synchronous detector is a balanced multiplier, the network $T_c$ may include that portion of the balanced multiplier which generates the delay $T_2$. FIG. 7 illustrates a balanced multiplier type of synchronous detector and a delay network $T_c$ for use therewith.

The illustrated synchronous detector includes a pair of transistors 44 and 46 interconnected as a differential amplifier and having emitter resistors R. A bias voltage $V_b$ is applied to the bases of both transistors and a video I.F. input signal (coupled from node A in FIG. 5) is applied to the bases of transistors 44 and 46 via a lead 48. The collectors of transistors 44 and 46 carry video currents $I_1$ and $I_2$, the current $I_1$ being out of phase with the video input signal by $-T_2$ and the current $I_2$ being out of phase with the video input signal by 180 degrees minus $T_2$. The currents $I_1$ and $I_2$ are coupled, respectively, to differential amplifiers 50 and 52. When the bases of the differential amplifiers 50 and 52 are fed with an oscillator signal via leads 54 and 56, a detected video signal is developed at the output 58.

The delay network $T_c$ includes a pair of transistors 60 and 62 interconnected as a differential amplifier and having emitter resistors R. Both transistors receive the bias voltage $V_b$ as well as the oscillator signal (from node E in FIG. 5) via a lead 64. Preferably, the transistors 60 and 62 match the transistors 44 and 46 so that currents $I_3$ and $I_4$ are developed whose phases are offset from the VCO input at lead 64 by the same amount that the currents $I_1$ and $I_2$ are offset from the video input at lead 48.

The collectors of transistors 60 and 62 are coupled to an operating voltage $V_{b1}$ through diodes $D_1$ and $D_2$ and to the leads 54 and 56. With this arrangement, the leads 54 and 56 carry oscillator currents which are in phase with the currents $I_1$ and $I_2$ so that the differential amplifiers 50 and 52 detect the video I.F. signal along a zero degree detection axis.

In the description above, it was assumed that it is desirable for the synchronous detector to operate at a zero degree detection axis. However, the invention is equally useful in applications in which a non-zero detection axis is desired. For example, if it is desired to detect the video signal along an axis of 20 degrees, the compensating network $T_c$ may be selected to cause a phase offset of 20 degrees between the oscillator signal and the video signal.

It will be obvious to those skilled in the art that many other modifications and alterations may be made to the illustrated structure without departing from the invention. By way of example, the structure may be modified to provide for a 180 degree detection axis rather than a zero degree detection axis where it is desired to develop a demodulated video signal which is inverted. Accordingly, all such modifications and alterations are deemed to be within the spirit and scope of the invention as defined by the appended claims.

What is claimed is:

1. In a television receiver which develops a video I.F. signal and which has a phase locked loop for developing an oscillator signal whose phase tracks with the variations in the phase of the video I.F. signal, and a synchronous detector receiving the video I.F. signal and the oscillator signal for demodulating the video I.F. signal, a phasing circuit for automatically controlling the phase of the oscillator signal relative to the video signal input to the synchronous detector, comprising:

means including a phase adjustment network for coupling the video I.F. signal to the phase locked loop and for varying the phase of the latter signal input to the phase locked loop on a continuously variable basis in response to a phase correction signal; and means sensing the video I.F. signal and the video input to the phase locked loop for developing and coupling to the phase adjustment network a phase correction signal such that the latter network varies the phase of the video I.F. input to the phase locked loop until the phase of the oscillator signal has a selected phase relationship to the video I.F. signal input to the synchronous detector.

2. A phasing circuit as set forth in claim 1 wherein said sensing means includes a multiplier receiving the video I.F. signal and the output of the phase adjustment network for developing a D.C. phase correction signal, and wherein the phase adjustment network is responsive to said D.C. signal for varying the phase of the video I.F. signal input to the phase locked loop.

3. A phasing circuit as set forth in claim 1 wherein said means coupling the video I.F. signal to the phase locked loop includes a tuneable limiter receiving the video I.F. signal for coupling an amplitude-limited video I.F. signal to the phase adjustment network, and means for coupling the output of the latter network to the phase locked loop, and wherein said sensing means is adapted to control the phase adjustment network such that a selected phase difference is established and held between the input to the limiter and the output of the phase adjustment network irrespective of the tuning of the limiter.

4. A phasing circuit as set forth in claim 1 wherein the phase locked loop provides a given phase difference between its received video I.F. signal and its oscillator output signal, and wherein said sensing means is adapted to control the phase adjustment network such that a corresponding given phase difference is provided between the video I.F. signal and the output of the phase adjustment network so as to compensate for phase delays provided by the phase locked loop.

5. A phasing circuit as set forth in claim 4 wherein the synchronous detector provides another phase difference of a given value between its video and oscillator inputs, and further including means coupled between the phase locked loop and the synchronous detector for providing a delay of the latter given value to the oscillator signal so as to compensate for the delay associated with the synchronous detector.

6. In a television receiver having a tuneable limiter receiving an input video I.F. signal, having a phase locked loop which receives an amplitude-limited video I.F. signal from the limiter for developing an oscillator signal whose phase is offset from the phase of the amplitude-limited video I.F. signal by a given phase angle, and having a synchronous detector receiving the video I.F. signal and the oscillator signal for developing a demodulated video signal, a phasing circuit for automatically controlling the relative phase between the oscillator signal and the video I.F. signal input to the synchronous detector, comprising:

- a phase adjustment network coupled between the limiter and the phase locked loop and responsive to a D.C. phase correction signal for varying the phase of the amplitude-limited video I.F. input to the phase locked loop on a continuously variable basis; and
- a multiplier receiving the input video I.F. signal and the output of the phase adjustment network for developing a D.C. phase correction signal input to the phase adjustment network such that the latter network applies to the phase locked loop a video I.F. signal whose phase is offset from the input video I.F. signal by the given phase angle so that the phase offset associated with the phase locked loop is compensated for by a corresponding phase offset between the input video I.F. signal and the input to the phase locked loop, thereby providing to the synchronous detector an oscillator signal which is in phase with the input video I.F. signal.

7. A phasing circuit as set forth in claim 6 wherein the multiplier and the phase detector are matched balanced multipliers.

8. A phasing circuit as set forth in claim 6 wherein the synchronous detector provides an inherent phase difference of a known value between its video and oscillator inputs, and further including means coupled between the phase locked loop and the synchronous detector for providing a delay of substantially the same known value to the oscillator signal so as to compensate for the delay associated with the synchronous detector.

9. In a television receiver having a tuneable limiter receiving an input video I.F. signal, having a phase locked loop which receives an amplitude-limited video I.F. signal from the limiter for developing an oscillator signal whose phase is offset from the phase of the amplitude-limited video I.F. signal by a given phase angle, and having a synchronous detector receiving the video I.F. signal and the oscillator signal for developing a demodulated video signal, a phasing circuit for automatically controlling the relative phase between the oscillator signal and the video I.F. signal input to the synchronous detector, comprising:

- a phase adjustment network coupled between the limiter and the phase locked loop and responsive to a D.C. phase correction signal for varying the phase of the amplitude-limited video I.F. input to the phase locked loop;
- a multiplier receiving the video I.F. signal and the output of the phase adjustment network for developing a D.C. phase correction signal input to the phase adjustment network such that the latter network holds the phase of its video I.F. output signal at a selected phase angle with respect to the video I.F. input signal irrespective of variations in the tuning of the limiter; and
- a delay network coupled between the phase locked loop and the synchronous detector for providing a delay to the oscillator signal of a value selected to compensate for any delay associated with the synchronous detector.

* * * * *